(12) United States Patent
Yang

(10) Patent No.: US 9,923,068 B2
(45) Date of Patent: Mar. 20, 2018

(54) ARRAY SUBSTRATE AND METHOD OF FABRICATING THE SAME

(71) Applicant: LG DISPLAY CO., LTD, Seoul (KR)

(72) Inventor: Joon-Young Yang, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/366,936

(22) Filed: Dec. 1, 2016

(65) Prior Publication Data

US 2017/0084707 A1 Mar. 23, 2017

Related U.S. Application Data

(62) Division of application No. 14/538,501, filed on Nov. 11, 2014, now Pat. No. 9,543,339, which is a division
(Continued)

(30) Foreign Application Priority Data

Dec. 10, 2012 (KR) .......................... 10-2012-0142875

(51) Int. Cl.
*H01L 29/417* (2006.01)
*H01L 33/00* (2010.01)
(Continued)

(52) U.S. Cl.
CPC ........ *H01L 29/41733* (2013.01); *H01L 21/44* (2013.01); *H01L 27/124* (2013.01);
(Continued)

(58) Field of Classification Search
CPC ............... H01L 27/124; H01L 27/1288; H01L 27/1248; H01L 27/1296; H01L 27/3244; H01L 27/3281; H01L 27/1251; H01L 27/1225; H01L 29/7869; H01L 29/78696; H01L 29/78693; H01L 29/41733; H01L 21/0272; G02F 1/1362; G02F 2001/136236
See application file for complete search history.

(56) References Cited

U.S. PATENT DOCUMENTS

| | | |
|---|---|---|
| 6,534,788 B1 | 3/2003 | Yeo et al. |
| 2008/0142797 A1 | 6/2008 | Lee et al. |
| 2012/0037910 A1 | 2/2012 | Choi |

FOREIGN PATENT DOCUMENTS

KR 10-2012-0129746 A 11/2012

OTHER PUBLICATIONS

European Search Report, dated Aug. 10, 2017, for European Application No. EP 13 17 3321, 2 pages.

*Primary Examiner* — Tucker J Wright
(74) *Attorney, Agent, or Firm* — Seed Intellectual Property Law Group LLP

(57) ABSTRACT

An array substrate includes an oxide semiconductor layer; an etch stopper including a first contact hole exposing each of both sides of the oxide semiconductor layer; source and drain electrodes spaced apart from each other with the oxide semiconductor layer therebetween; a first passivation layer including a contact hole exposing each of both ends of the oxide semiconductor layer and each of ends of the source and drain electrode that oppose the both ends of the oxide semiconductor layer, respectively; and a connection pattern at the second contact hole contacting both the oxide semiconductor layer and each of the source and drain electrodes.

1 Claim, 25 Drawing Sheets

Related U.S. Application Data of application No. 13/966,507, filed on Aug. 14, 2013, now Pat. No. 8,912,539.

(51) Int. Cl.
  *H01L 27/12* (2006.01)
  *H01L 21/44* (2006.01)
  *H01L 29/786* (2006.01)

(52) U.S. Cl.
  CPC ...... *H01L 27/1225* (2013.01); *H01L 27/1248* (2013.01); *H01L 27/1288* (2013.01); *H01L 27/1296* (2013.01); *H01L 29/41775* (2013.01); *H01L 29/78636* (2013.01); *H01L 33/0041* (2013.01); *H01L 29/7869* (2013.01)

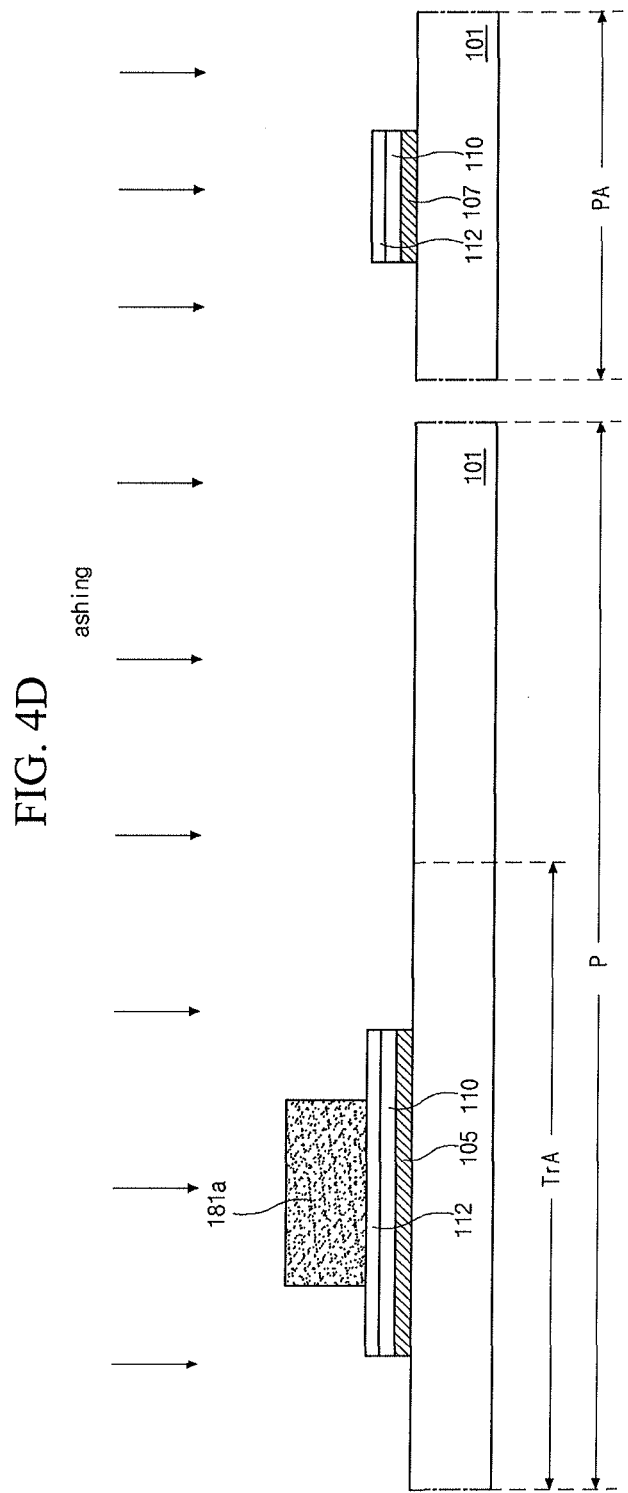

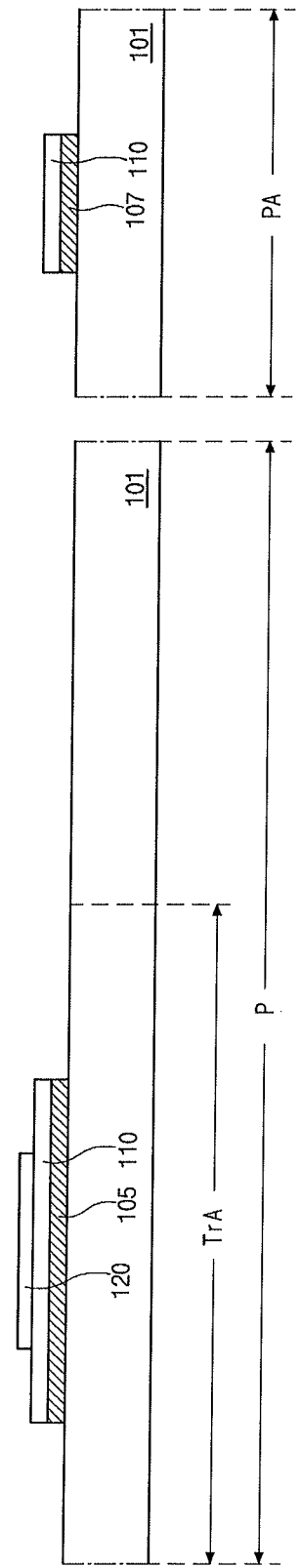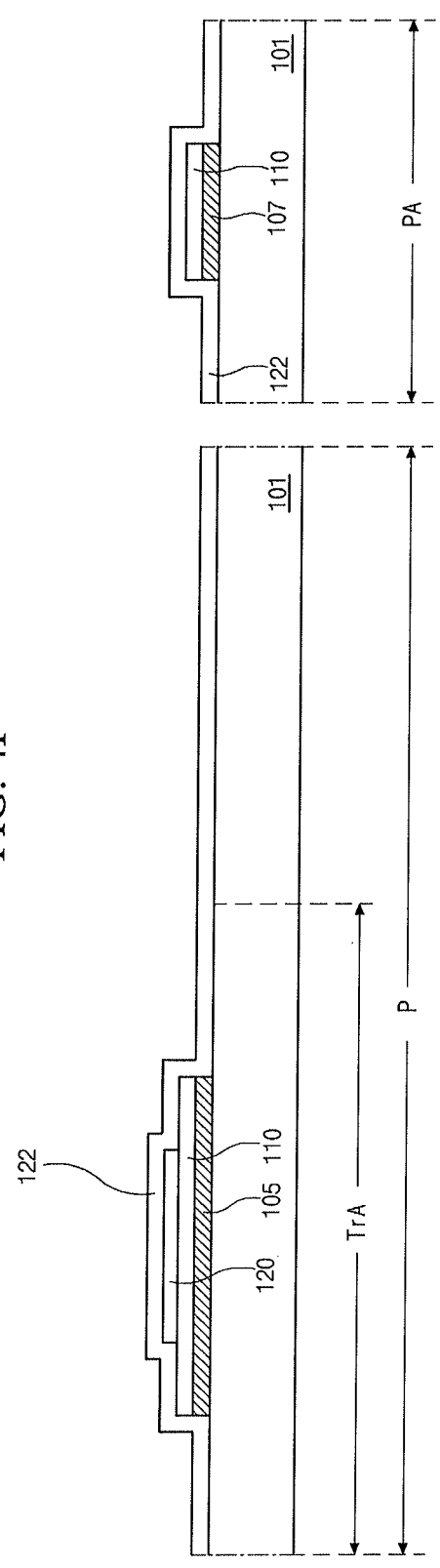

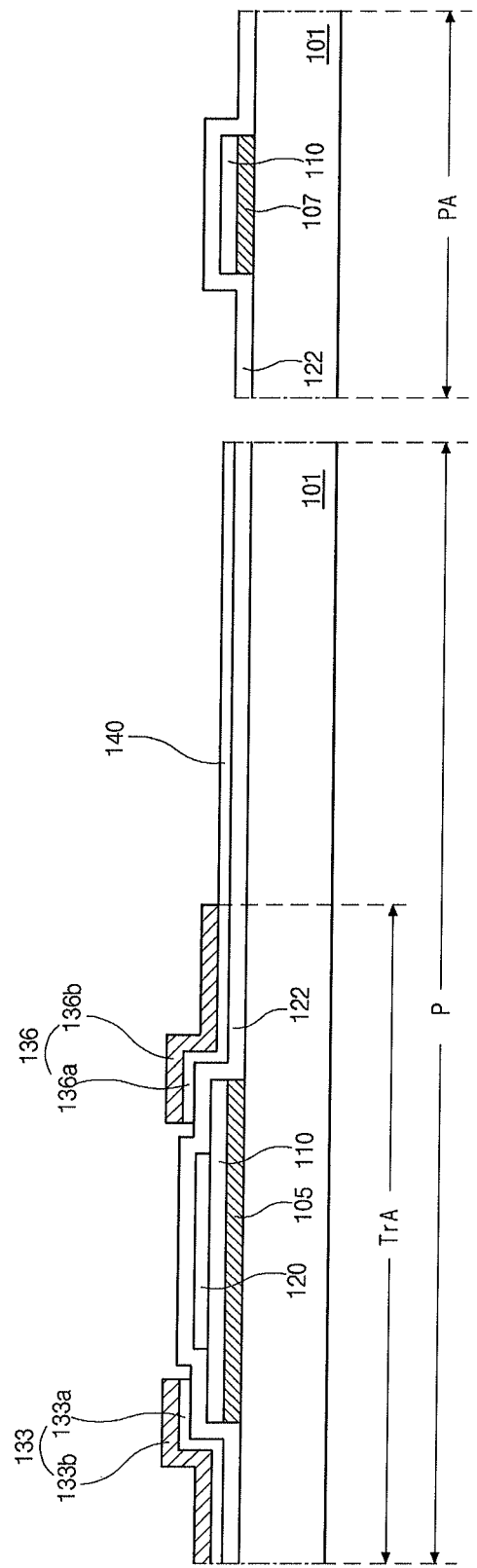

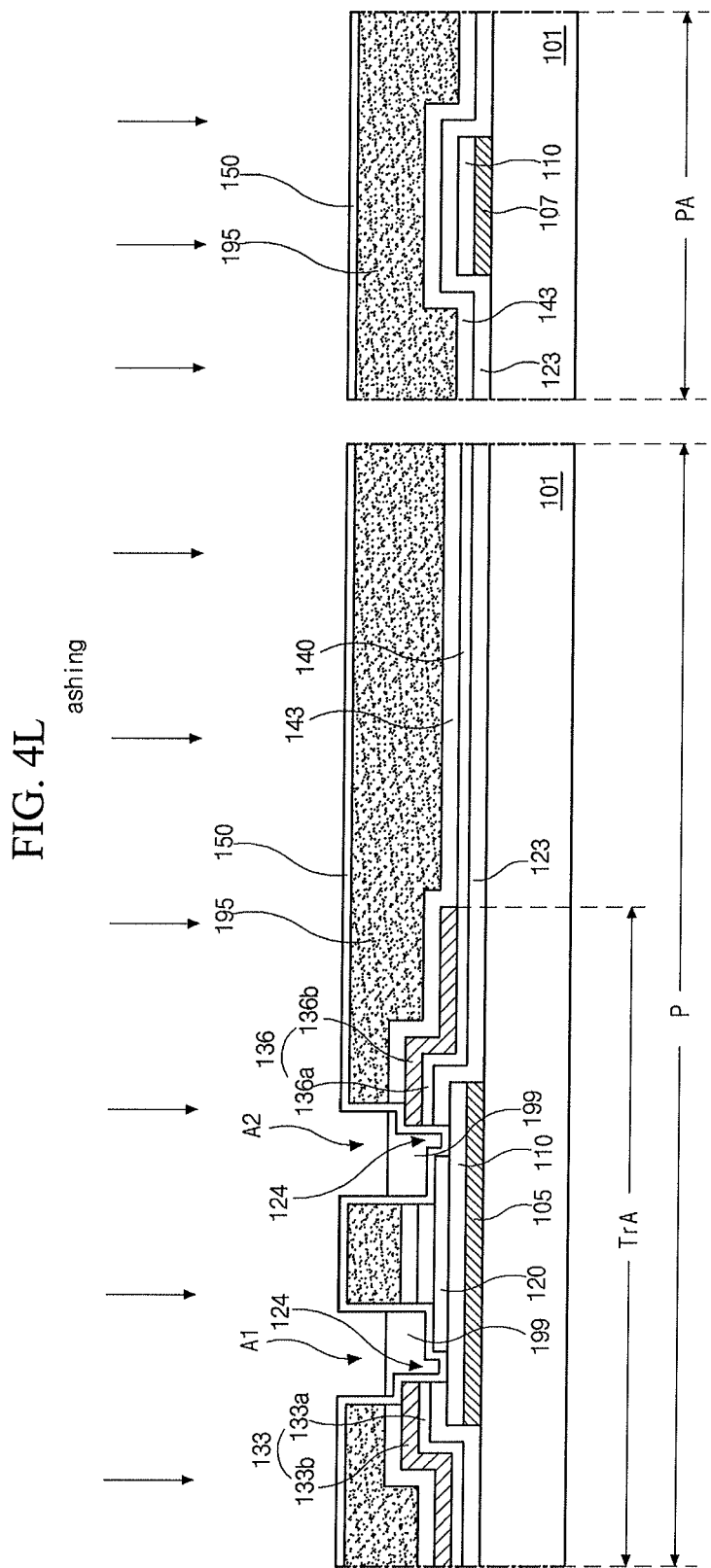

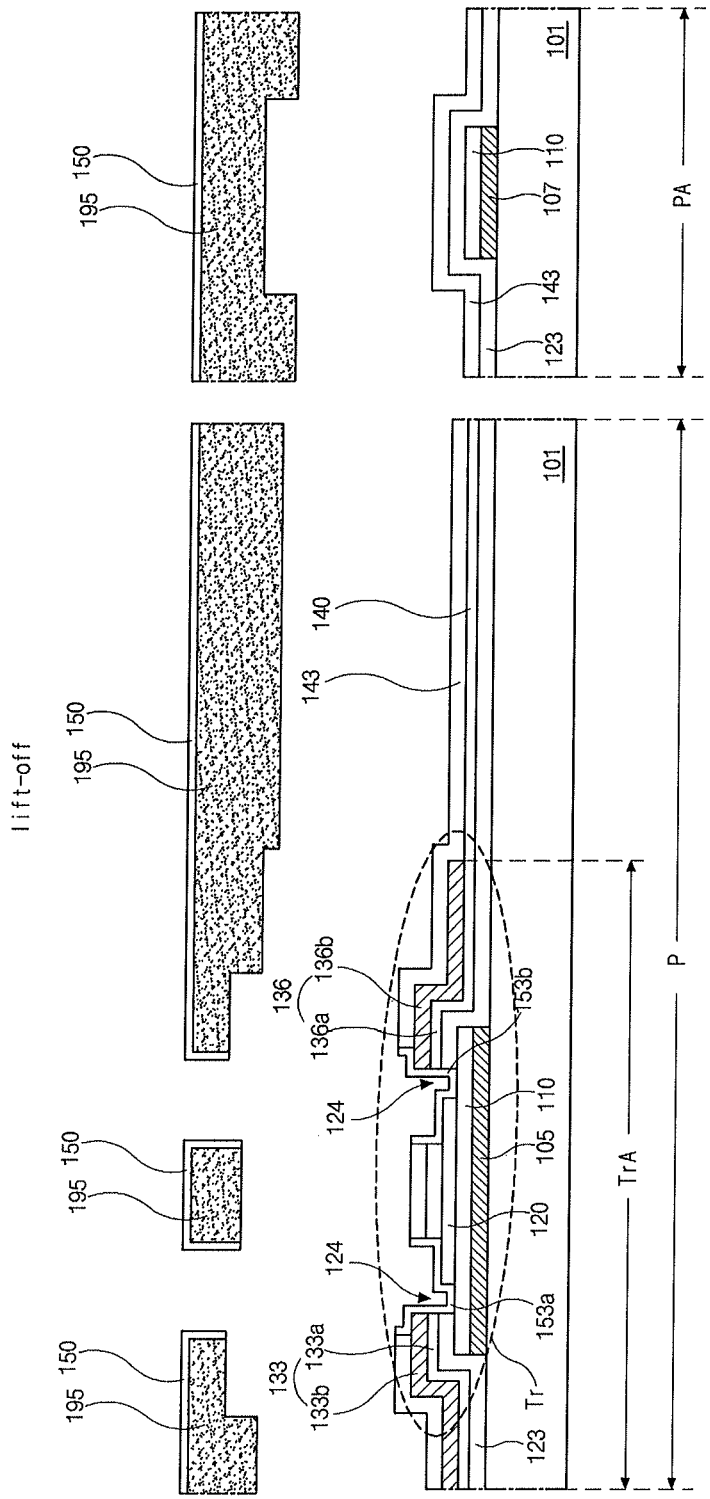

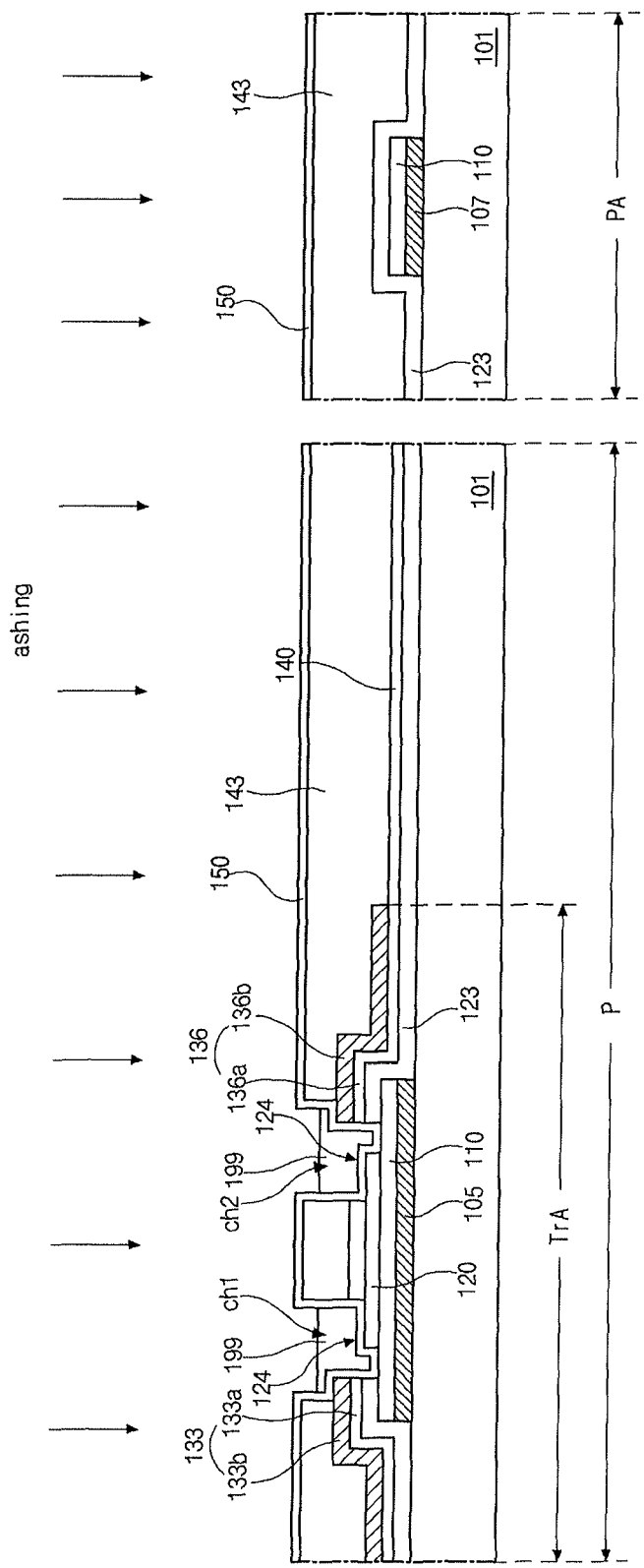

ARRAY SUBSTRATE AND METHOD OF FABRICATING THE SAME

This present patent document is a divisional of U.S. patent application Ser. No. 14/538,501, filed Nov. 11, 2014, which is a divisional of U.S. patent application Ser. No. 13/966,507, filed on Aug. 14, 2013, which claims the benefit of Korean Patent Application No. 10-2012-0142875, filed in Korea on Dec. 10, 2012, which is incorporated by reference in its entirety.

BACKGROUND

Field of the Disclosure

The present disclosure relates to an array substrate, and more particularly, to an array substrate and a method of fabricating the same.

Discussion of the Related Art

Recently, with the advent of an information-oriented society, the field of display devices configured to process and display a large amount of information has rapidly been developed. In particular, liquid crystal displays (LCDs) or organic light emitting diodes (OLEDs) have lately been developed as flat panel displays (FPDs) having excellent performance, such as a small thickness, light weight, and low power consumption, and has superseded conventional cathode-ray tubes (CRTs).

Among LCDs, an active matrix (AM)-type LCD including an array substrate having a TFT serving as a switching element capable of controlling on/off voltages of each of pixels may have excellent resolution and capability of embodying moving images.

FIG. 1 is a cross-sectional view illustrating a pixel region including a thin film transistor in an array substrate of an LCD or an OLED according to the related art.

As shown in FIG. 1, a plurality of gate lines (not shown) and a plurality of data lines 33 cross each other on an array substrate 11 to define a plurality of pixel regions P. A gate electrode 15 is formed in a switching region TrA of each pixel region P. A gate insulating layer 18 is formed entirely on the gate electrode 15, and a semiconductor layer 28 including an active layer 22 of intrinsic amorphous silicon and an ohmic contact layer 26 of impurity-doped amorphous silicon is formed on the gate insulating layer 18.

A source electrode 36 and a drain electrode 38 are formed on the ohmic contact layer 26 corresponding to the gate electrode 15 and spaced apart from each other. The gate electrode 15, the gate insulating layer 18, the semiconductor layer 28, and the source and drain electrodes 36 and 38, which are sequentially stacked at the switching region TrA, forms a thin film transistor Tr.

Furthermore, a passivation layer 42 including a drain contact hole 45 and exposing the drain electrode 38 is formed entirely on the source and drain electrodes 36 and 38. A pixel electrode 50 is formed in each of pixel regions P on the passivation layer 42 and contacts the drain electrode 38 through the drain contact hole 45. A semiconductor pattern 29 is formed below the data line 33 and has a double-layered structure of first and second patterns 27 and 23, which are made of the same materials as the ohmic contact layer 26 and the active layer 22, respectively.

In the semiconductor layer 28 of the thin film transistor Tr formed in the switching region TrA, the active layer 22 has a first thickness t1 where the ohmic contact layer 26 is formed and has a second thickness t2 where the ohmic contact layer 26 is removed and exposed. This difference in thickness is caused by a fabrication method, and since the thickness is reduced at the portion exposed between the source and drain electrodes 36 and 38, property of the thin film transistor Tr is degraded.

To solve this problem, a thin film transistor shown in FIG. 2 is developed, which does not need an ohmic contact layer and has a single-layered oxide semiconductor layer 79.

FIG. 2 is a cross-sectional view illustrating a pixel region of an array substrate including a thin film transistor having an oxide semiconductor layer according to the related art.

Referring to FIG. 2, a thin film transistor Tr includes a gate electrode 73 on a substrate 71, a gate insulating layer 75, an oxide semiconductor layer 77, source and drain electrodes 81 and 83, and an etch stopper 79. A passivation layer 85 is on the transistor Tr and has a drain contact hole 87 exposing the drain electrode 83. A pixel electrode 89 is on the passivation layer 85 and contacts the drain electrode 83 through the drain contact hole 87.

Since the ohmic contact layer is not needed, the oxide semiconductor layer 77 is not required to be exposed in a dry-etching, which is performed to form the ohmic contact layers of impurity-doped amorphous silicon spaced apart from each other, and degradation of property of thin film transistor Tr can be prevented.

Further, carrier mobility of the oxide semiconductor layer 77 is a several times to a ten times greater than that of the semiconductor layer using the amorphous silicon, and it is advantageous to a driving transistor.

However, when the oxide semiconductor layer 77 is exposed to an etching solution to pattern a metal layer, the oxide semiconductor layer 77 is removed because of no etch selectivity with the metal layer or causes degradation of property of the thin film transistor Tr because of damage to molecule structure of the oxide semiconductor layer 77.

Further, when the oxide semiconductor layer 77 is exposed to an etching solution, reliability of operation of the thin film transistor Tr is degraded, and particularly, variation rate of threshold voltage greatly changes as time passes in a BTS (bias temperature stress) test, and thus property distribution or divergence in display region is great, and thus display quality is adversely affected.

To solve the problems, in order that a center portion of the semiconductor layer 77 i.e., a channel portion, is not exposed to an etching solution which reacts with a metal material for the source and drain electrodes 81 and 83 in a pattering process of forming the source and drain electrodes 81 and 83, an etch stopper 79 made of inorganic insulating material is formed on the center portion of the semiconductor layer 77.

However, the array substrate 71 including the thin film transistor Tr having the oxide semiconductor layer and the etch stopper 79 needs margin to contact between the oxide semiconductor layer 77 and the source and drain electrodes 81 and 83 because of the etch stopper 79. Accordingly, the source and drain electrodes 81 and 83 needs to be formed relatively long, and thus overlapping area with the gate electrode 73 increases and parasitic capacitance increases. Further, one mask process is required to form the etch stopper 79, and thus the array substrate is fabricated with six (or five) mask processes.

The mask process includes five steps of a photoresist deposition, a light exposure, a developing, an etching and a stripping, and thus the mask process is complicated and requires many solutions. Accordingly, as a number of the mask process increases, production time increases and production rate decreases, error rate increases, and production cost increases.

Accordingly, reductions of parasitic capacitance and a number of mask processes for the array substrate shown in FIG. 2 are required.

SUMMARY

An array substrate comprises a gate electrode connected to a gate line; a gate insulating layer on the gate electrode; an oxide semiconductor layer on the gate insulating layer, exposing both sides of the gate insulating layer; an etch stopper on the oxide semiconductor layer and entirely over the substrate, the etch stopper includes a first contact hole exposing each of both sides of the oxide semiconductor layer; a source electrode, a drain electrode and a pixel electrode on the etch stopper, wherein the source and drain electrodes are spaced apart from each other with the oxide semiconductor layer therebetween, wherein the pixel electrode is connected to the drain electrode; a first passivation layer on the source and drain electrodes and the pixel electrode and entirely over the substrate, the first passivation layer includes a second contact hole which fully overlaps the first contact hole and has an area greater than the first contact hole, the second contact hole exposes each of both ends of the source and drain electrode that oppose the both ends of the oxide semiconductor layer, respectively; and a connection pattern contacting both the oxide semiconductor layer and the source and drain electrodes respectively.

A method of fabricating an array substrate, comprises: forming a gate electrode on a substrate, a gate insulating layer on the gate electrode, an island-shaped oxide semiconductor layer on the gate insulating layer corresponding to the gate electrode; forming an etch stopper on the oxide semiconductor layer and entirely over the substrate; forming a source electrode, a drain electrode and a pixel electrode on the etch stopper, wherein the source and drain electrodes are spaced apart from each other with the oxide semiconductor layer therebetween, wherein the pixel electrode is connected to the drain electrode; forming a first passivation layer on the source and drain electrodes and the pixel electrode and entirely over the substrate; forming a first and second separate region, the first separate region is located where an end of the oxide semiconductor layer and an end of the source electrode opposing each other are formed, and the second separate region is located where the other end of the oxide semiconductor layer and an end of the drain electrode opposing each other are formed, forming a conductive material layer at least in the first and second separate region to form connection patterns which connect the oxide semiconductor layer to the source and drain electrodes at the first and second contact holes, respectively.

In yet another aspect, a method of fabricating an array substrate includes forming a gate line on a substrate including a pixel region, a gate electrode connected to the gate line, a gate insulating layer on the gate line and the gate electrode, an island-shaped oxide semiconductor layer on the gate insulating layer corresponding to the gate electrode; forming an etch stopper on the oxide semiconductor layer and entirely over the substrate; forming a data line, source and drain electrodes and a pixel electrode on the etch stopper, wherein the data line crosses the gate line to define the pixel region, wherein the source and drain electrodes are spaced apart from each other with the oxide semiconductor layer therebetween, wherein the pixel electrode is in the pixel region and connected to the drain electrode; forming a first passivation layer on the data line, the source and drain electrodes and the pixel electrode and entirely over the substrate, and having a substantially flat surface; forming a first photoresist pattern on the first passivation layer corresponding to the gate electrode and including a first separate region where an end of the oxide semiconductor layer and an end of the source electrode opposing the end of the oxide semiconductor layer are formed, and a second separate region where the other end of the oxide semiconductor layer and an end of the drain electrode opposing the other end of the oxide semiconductor layer are formed, wherein the first and second separate regions are formed by removing a first photoresist thereat; removing the first passivation layer and the etch stopper at the first and second separate regions to form a first contact hole exposing the end of the oxide semiconductor layer and the end of the source electrode, and a second contact hole exposing the other end of the oxide semiconductor layer and the end of the drain electrode; removing the first photoresist pattern to expose the first passivation layer; forming a conductive material layer on the first passivation layer and entirely over the substrate; forming an organic layer on the conductive material and entirely over the substrate, and including a portion at the first and second contact holes which is thicker than other portion; performing an ashing to reduce thickness of the organic layer at the same rate over all so that a surface of the conductive material layer on the first passivation layer is exposed, and the organic layer remains at the first and second contact holes and becomes an organic pattern; removing the conductive material layer on the first passivation layer to form connection patterns at the first and second contact holes, respectively; and performing a stripping to remove the organic pattern. By using the passivation layer according to this embodiment a planarization of the stepped structured is already achieved within the process of providing the connection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 5A and 5B are cross-sectional views illustrating a method of forming connection patterns according to another embodiment of the present invention; and FIGS. 6A to 6F are cross-sectional views illustrating a method of forming connection patterns according to yet another embodiment of the present invention.

DETAILED DESCRIPTION OF THE ILLUSTRATED EMBODIMENTS

Reference will now be made in detail to the illustrated embodiments of the present invention, which are illustrated in the accompanying drawings.

Figure 1:
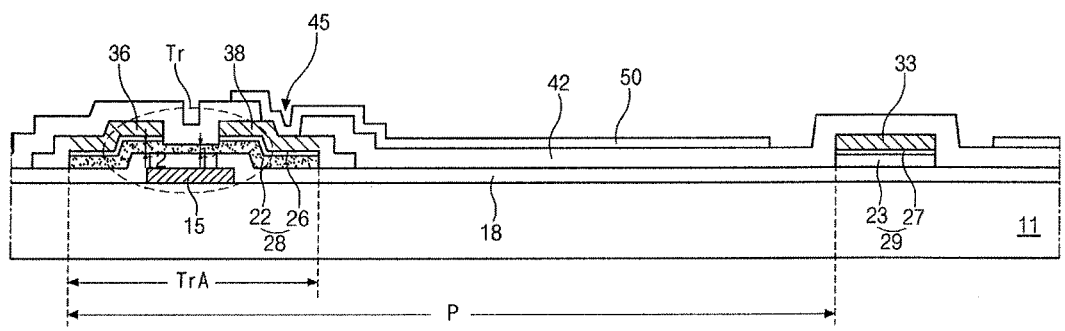
FIG. 1 is a cross-sectional view illustrating a pixel region including a thin film transistor in an array substrate of an LCD or an OLED according to the related art.
Figure 2:
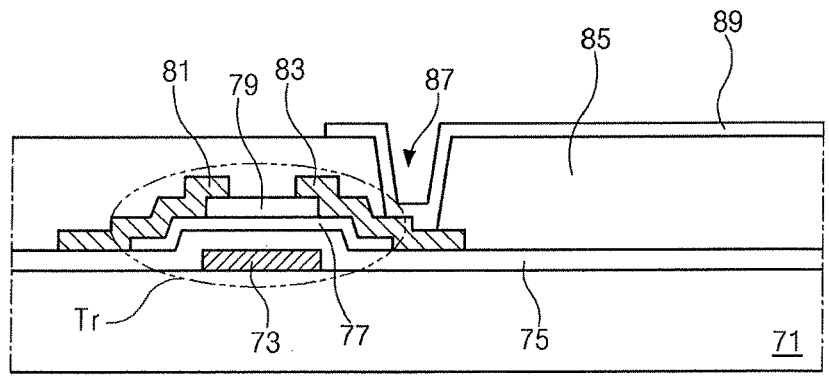
FIG. 2 is a cross-sectional view illustrating a pixel region of an array substrate including a thin film transistor having an oxide semiconductor layer according to the related art.
Figure 3:
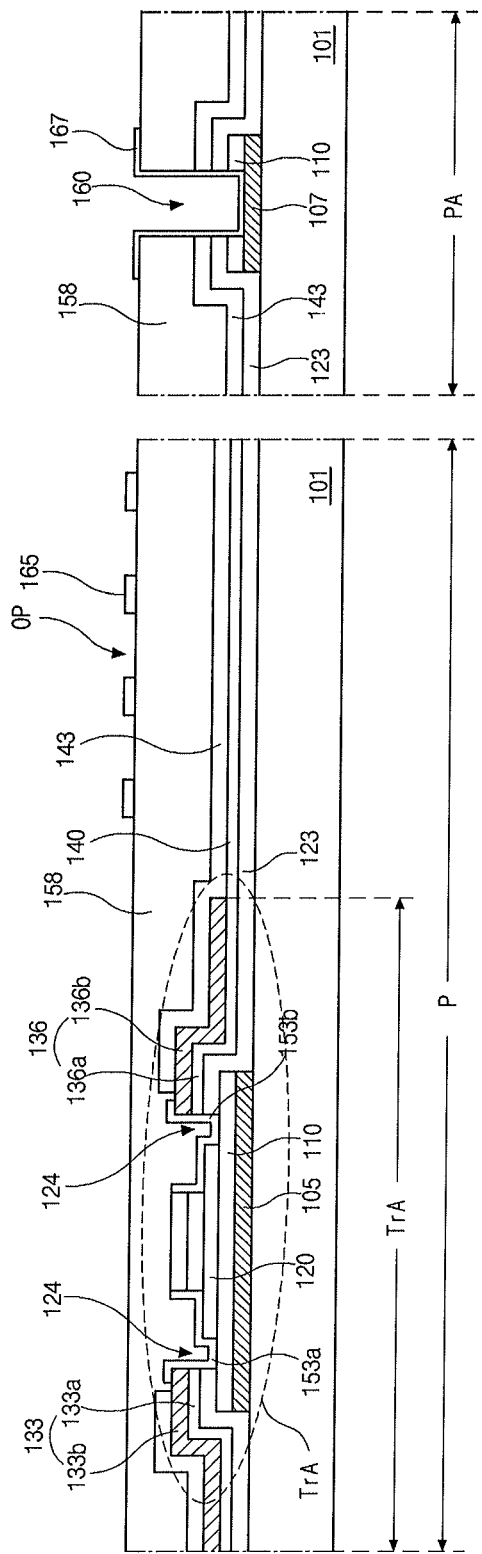
FIG. 3 is a cross-sectional view illustrating an array substrate including a thin film transistor having an oxide semiconductor layer according to an embodiment of the present invention.

FIG. 3 is a cross-sectional view illustrating an array substrate including a thin film transistor having an oxide semiconductor layer according to an embodiment of the present invention. For the purposes of explanation, a region where a thin film transistor Tr is formed in a pixel region P is defined as a switching region TrA.

Referring to FIG. 3, a gate line (not shown) is formed on an insulating substrate 101 made of transparent glass or plastic. The gate line may have a single-layered structure using a low resistance metal material, for example, aluminum (Al), aluminum alloy (e.g., AlNd), copper (Cu), copper alloy, molybdenum (Mo), or molybdenum titanium (MoTi), or a multiple-layered structure using two or more of the above-described metal materials.

A gate electrode 105 is formed in the switching region TrA. The gate electrode 105 may be formed as a portion of the gate line, or extend from the gate line.

In this embodiment, an example of the gate line and the gate electrode 105 having a single-layered structure is given.

A gate insulating layer 110 made of insulating material, for example, silicon oxide ($SiO_2$) or silicon nitride (SiNx) is formed on the gate line and the gate electrode 105.

In this embodiment, the gate insulating layer 110 has a plane shape as the gate line and the gate electrode 105 and is formed directly on the gate line and the gate electrode 105.

In the switching region TrA, an island-shaped oxide semiconductor layer 120 made of indium gallium zinc oxide (IGZO), zinc tin oxide (ZTO), or zinc indium oxide (ZIO) is formed on the gate insulating layer 110 over the gate electrode 105. The oxide semiconductor layer 120 has an area less than the gate electrode 105 and is formed corresponding to a center portion of the gate electrode 105, and thus the gate insulating layer 110 is exposed outside the oxide semiconductor layer 120.

An etch stopper 123 made of inorganic insulating material, for example, silicon oxide ($SiO_2$) or silicon nitride (SiNx) is formed entirely on the substrate 101 having the oxide semiconductor layer 120.

The etch stopper 123 includes a contact hole 124 in the semiconductor layer 120 exposing each of both side surfaces of the oxide semiconductor layer 120 with respect to a center of the oxide semiconductor layer 120.

A data line (not shown) crossing the gate line to define the pixel region P is formed on the etch stopper 123, and source and drain electrodes 133 and 136 spaced apart from each other are formed on the etch stopper 123.

A pixel electrode 140 contacting the drain electrode 136 and made of transparent conductive material, for example, indium tin oxide (ITO) or indium zinc oxide (IZO) is formed on the etch stopper 123 in the pixel region P. The pixel electrode has a plate shape in the pixel region P.

Ends of the source and drain electrodes opposing each other substantially coincide with the corresponding edges of the etch stopper 123 therebelow, and are spaced apart from the corresponding both ends or side surfaces of the oxide semiconductor layer 120.

Even though not shown in the drawings, the other end of the source electrode 133 is connected to the data line.

The data line, and the source and drain electrodes 133 and 136 may have respective lower layers 133a and 136a, which are each made of the same material as the pixel electrode 140, and respective upper layers 133b and 136b, and the upper layer may have a single-layered structure using a low resistance material, for example, aluminum (Al), aluminum alloy (e.g., AlNd), copper (Cu), copper alloy, molybdenum (Mo), or molybdenum titanium (MoTi), or a multiple-layered structure which has using two or more of the above-described metal materials.

As such, the data line and the source and drain electrodes 133 and 136 have the multiple layers consisting of the lower layers 133a and 136a and the upper layers 133b and 136b. In the embodiment, an example of the data line and the source and drain electrodes 133 and 136 having double layers is given.

A first passivation layer 143 is formed on the data line and the source and drain electrodes 133 and 136.

The first passivation layer 143 includes two contact holes which exposes the both ends of the oxide semiconductor layer 120 and the corresponding ends of the source and drain electrodes 133 and 136 which oppose the both ends of the oxide semiconductor layer 120.

Connection patterns 153a and 153b are formed at the corresponding contact holes of the first passivation layer 143 and made of transparent conductive material, for example, indium tin oxide (ITO) or indium zinc oxide (IZO). The connection pattern 153a contacts the end of the source electrode 133 and the corresponding end of the oxide semiconductor layer 120, and the connection pattern 153b contacts the end of the drain electrode 136 and the corresponding end of the oxide semiconductor layer 120.

A second passivation layer 158 is formed entirely on the substrate 101 having the connection patterns 153a and 153b.

The second passivation layer 158 includes a gate pad contact hole 160 exposing a gate pad electrode 107 located at the end of the gate line and a data pad contact hole (not shown) exposing a data pad electrode (not shown) located at the end of the data line.

A common electrode 165 is formed on the second passivation layer 158 in the pixel region P and made of transparent conductive material, for example, indium tin oxide (ITO) or indium zinc oxide (IZO), and includes bar-shaped openings op.

In the pad portion PA, a gate auxiliary pad electrode contacting the gate pad electrode 107 and a data auxiliary pad electrode contacting the data pad electrode are formed.

The array substrate 101 including the above-described configuration is an array substrate for a fringe field switching (FFS) mode LCD in which the pixel electrode 140 and the common electrode 165 having the openings op produce an electric field.

The array substrate 101 can be fabricated with five mask processes. Accordingly, mask processes can be reduced by two or three mask processes compared to the related art array substrate for FFS mode LCD.

In this regard, the related art array substrate including an oxide semiconductor layer and island-shaped etch stopper requires five or six mask processes until forming a pixel electrode. In addition, to use the related art array substrate as an array substrate for a FFS mode LCD, it further requires two more mask processes of forming a second passivation layer, which is on a pixel electrode and has gate and data pad contact holes, and forming a bar-shaped common electrode. As a result, the related art array substrate for a FFS mode LCD requires seven or eight mask processes.

However, the array substrate 101 of the embodiment can be fabricated with five mask processes. Accordingly, a number of mask processes can be reduced by two or three.

Further, the etch stopper 123 is formed on the entire surface of the substrate 101, and the source and drain electrodes 133 and 136 are connected with the oxide semiconductor layer 120 through the connection patterns 153a and 153b. Accordingly, overlapping area between the source and drain electrodes 133 and 136 and the gate electrode 105 can be reduced compared to the related art. Therefore, parasitic capacitance due to overlapping between the source and drain electrodes 133 and 136 and the gate electrode 105 can be reduced.

A method of fabricating the array substrate according to the embodiment of the present invention is explained with reference to FIGS. 4A to 4P.

Figure 4A:
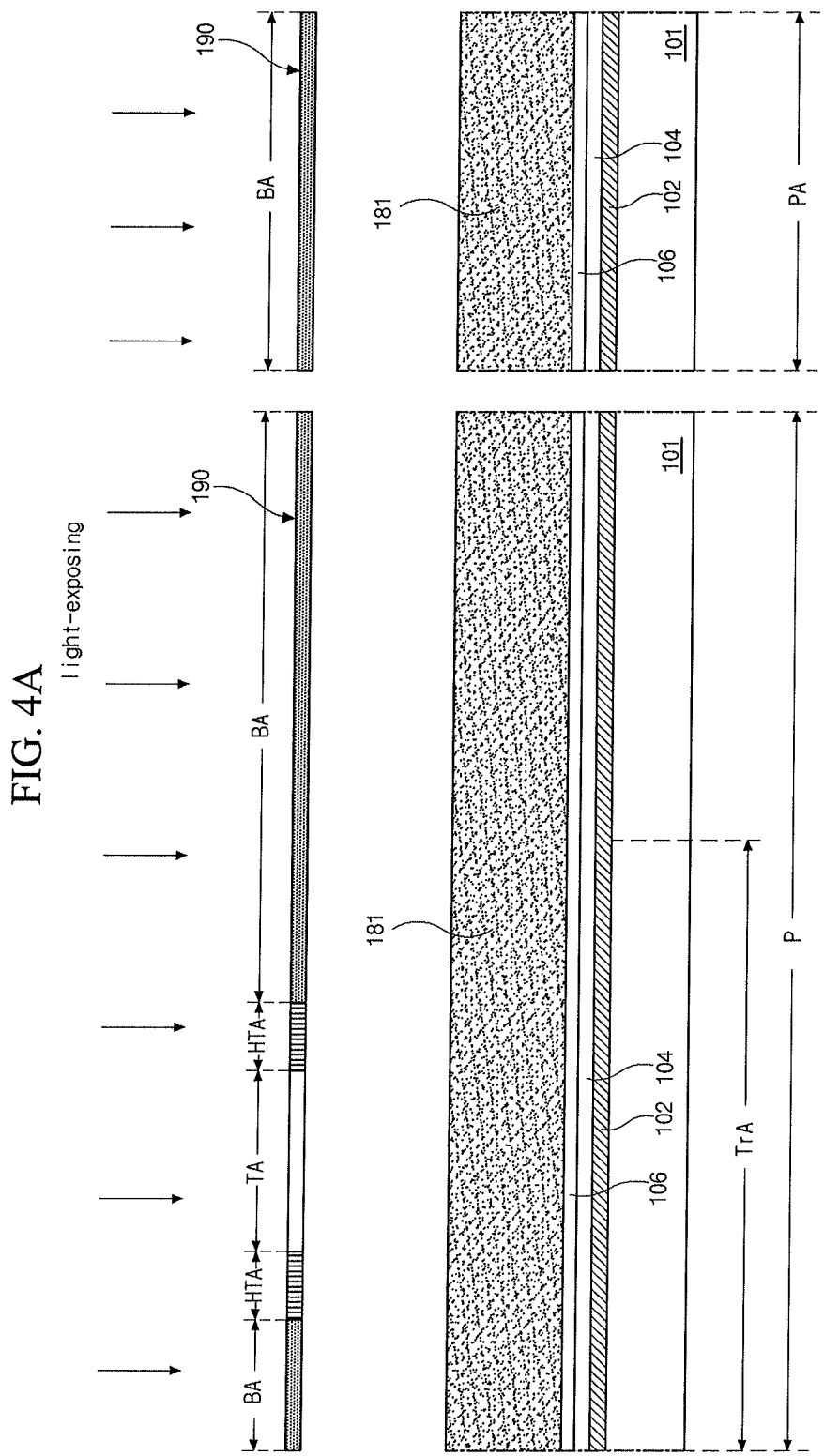
FIGS. 4A to 4P are cross-sectional views illustrating a method of fabricating an array substrate including a thin film transistor using an oxide semiconductor layer according to an embodiment of the present invention.
Figure 4B:
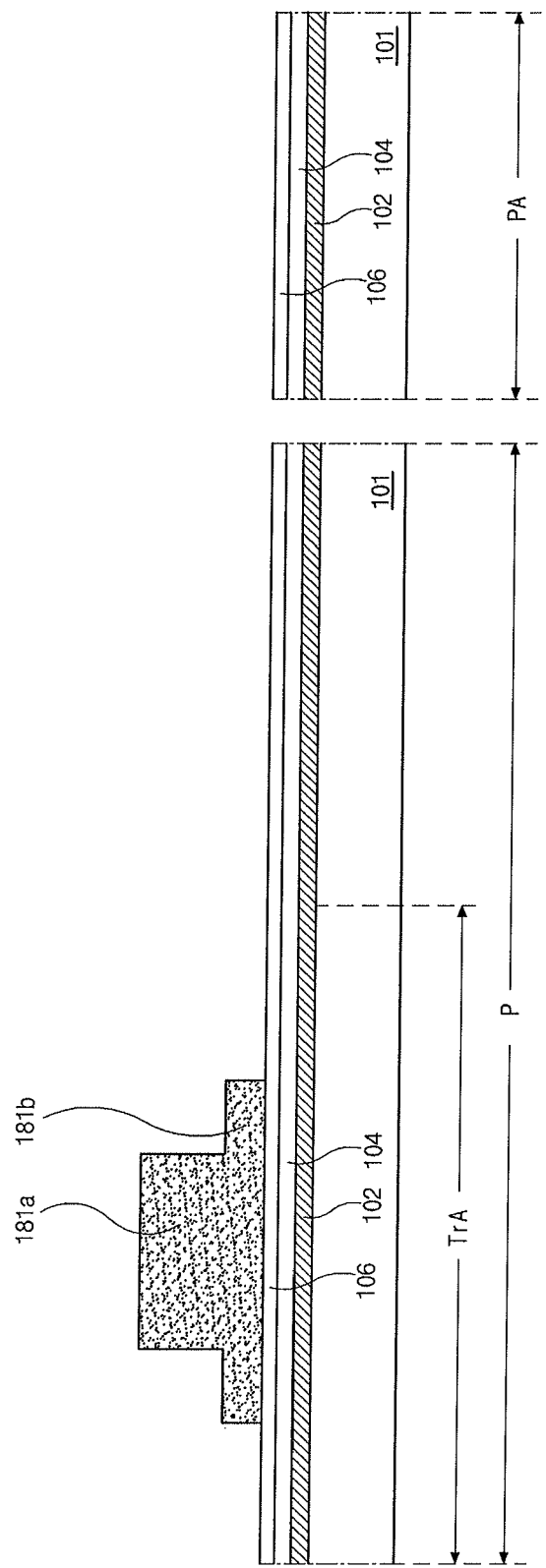
Figure 4C:
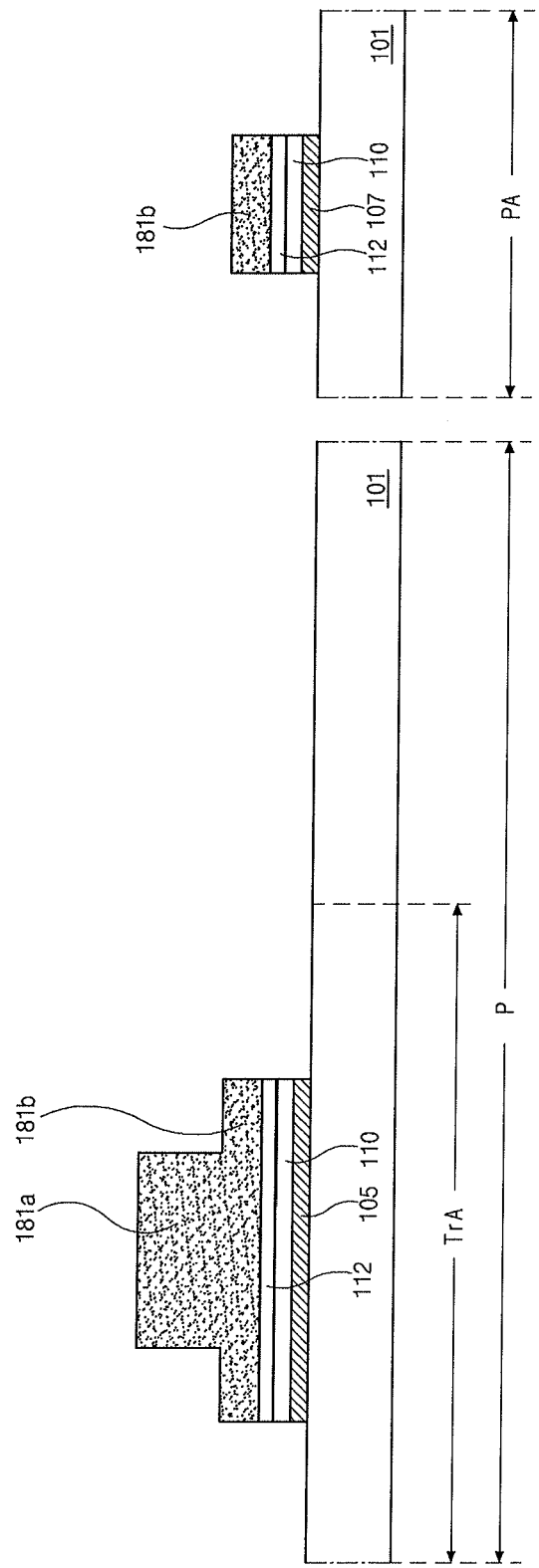
Figure 4H:
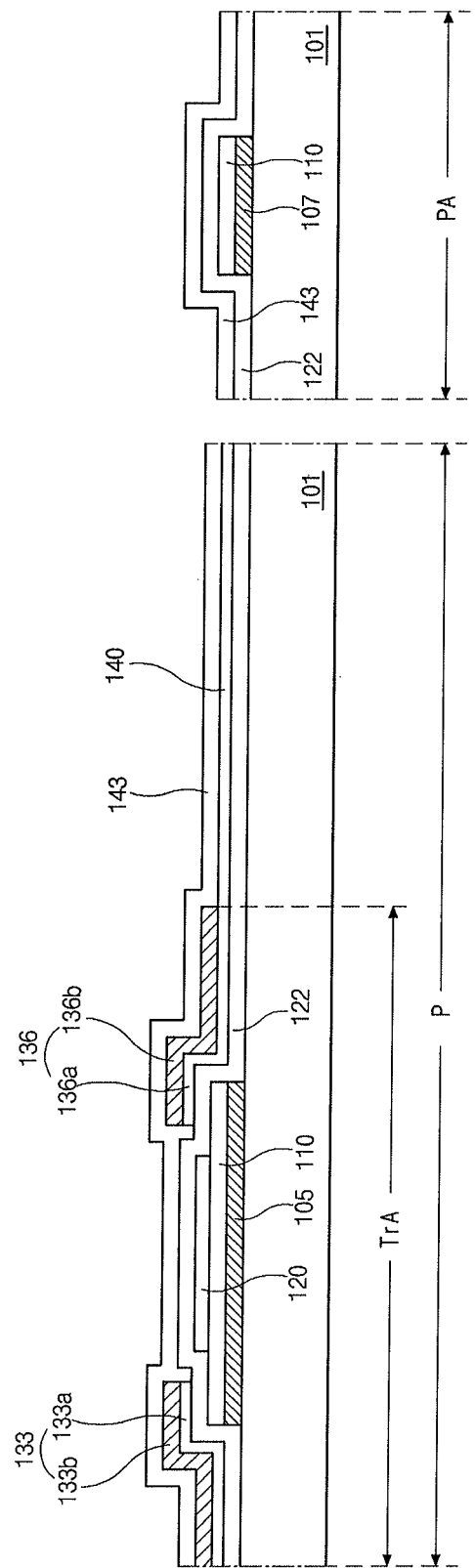
Figure 4I:
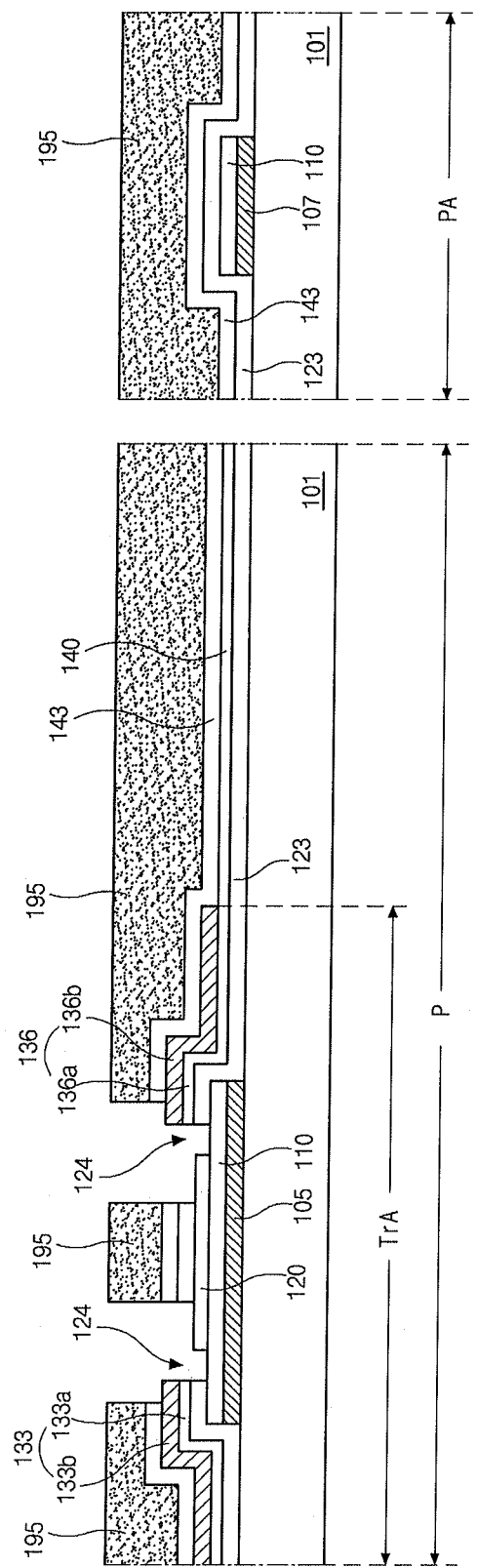
Figure 4J:
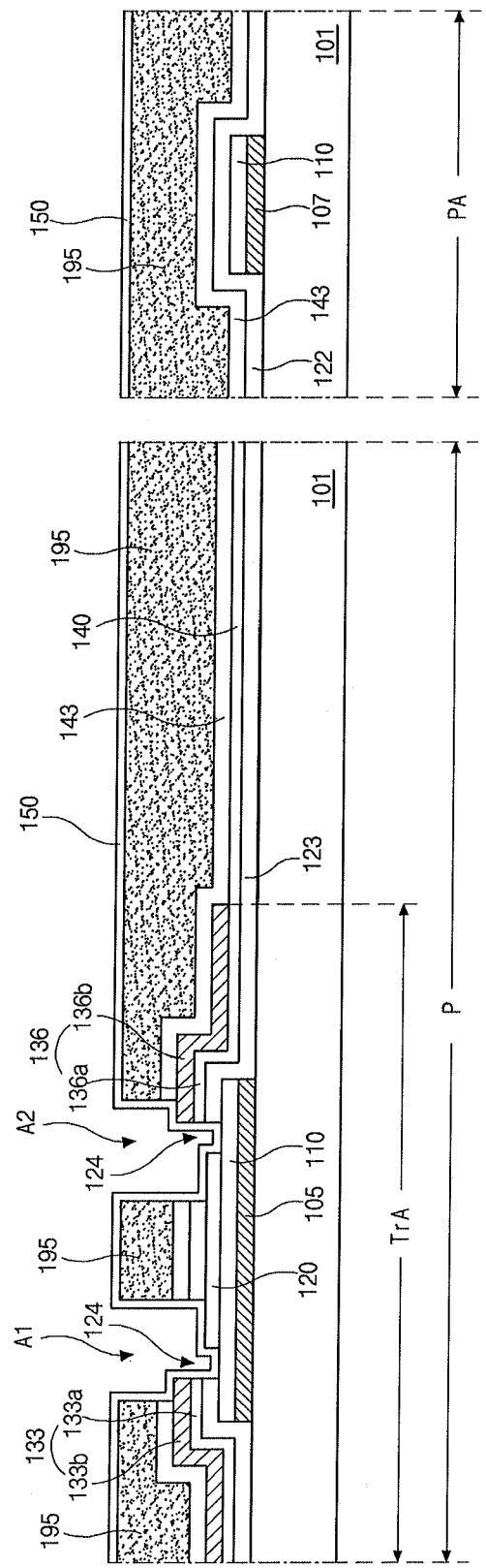
Figure 4K:
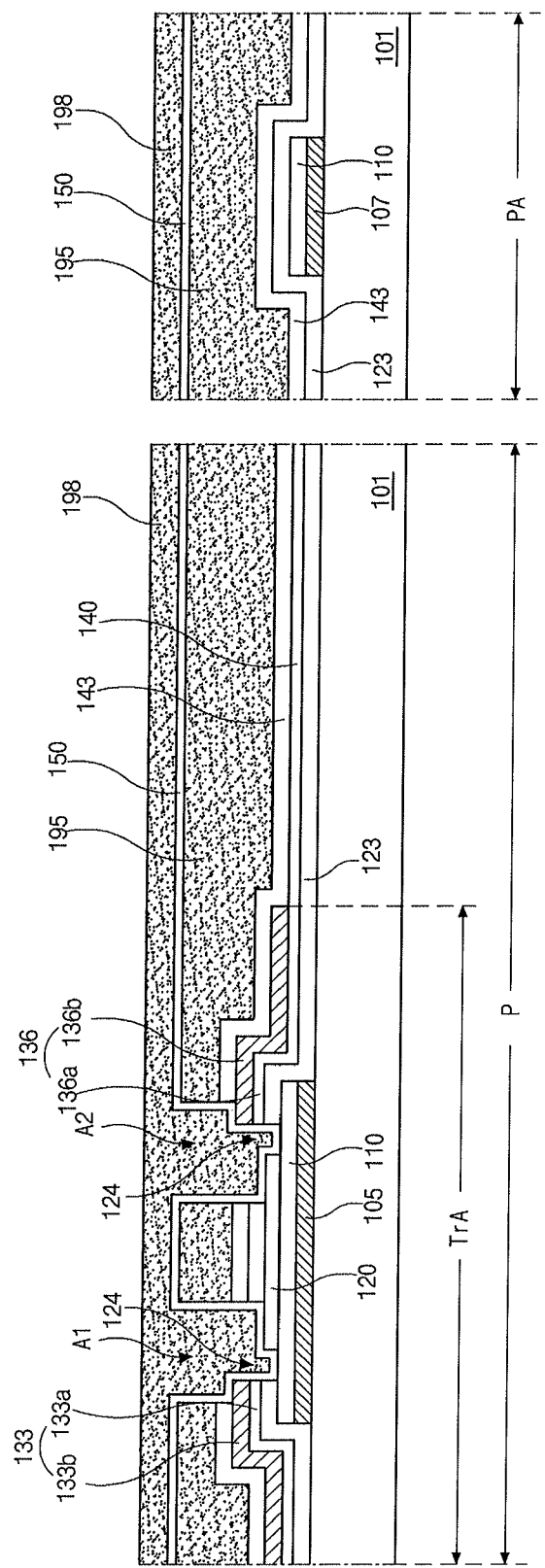
Figure 4M:
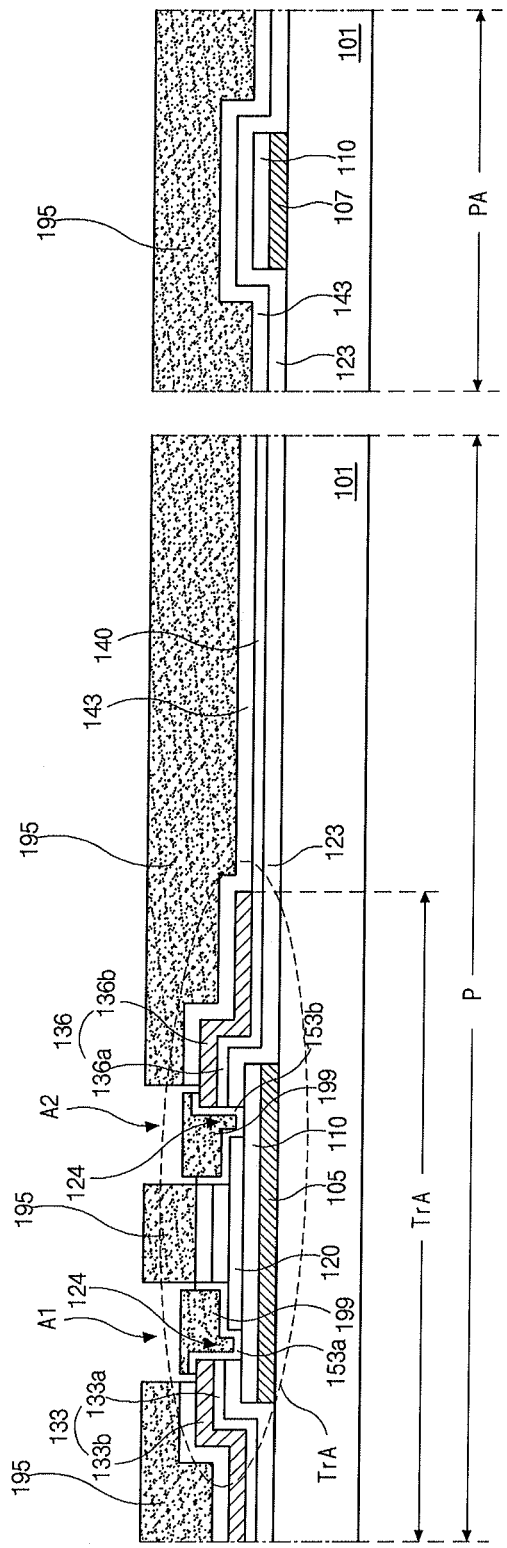
Figure 4N:
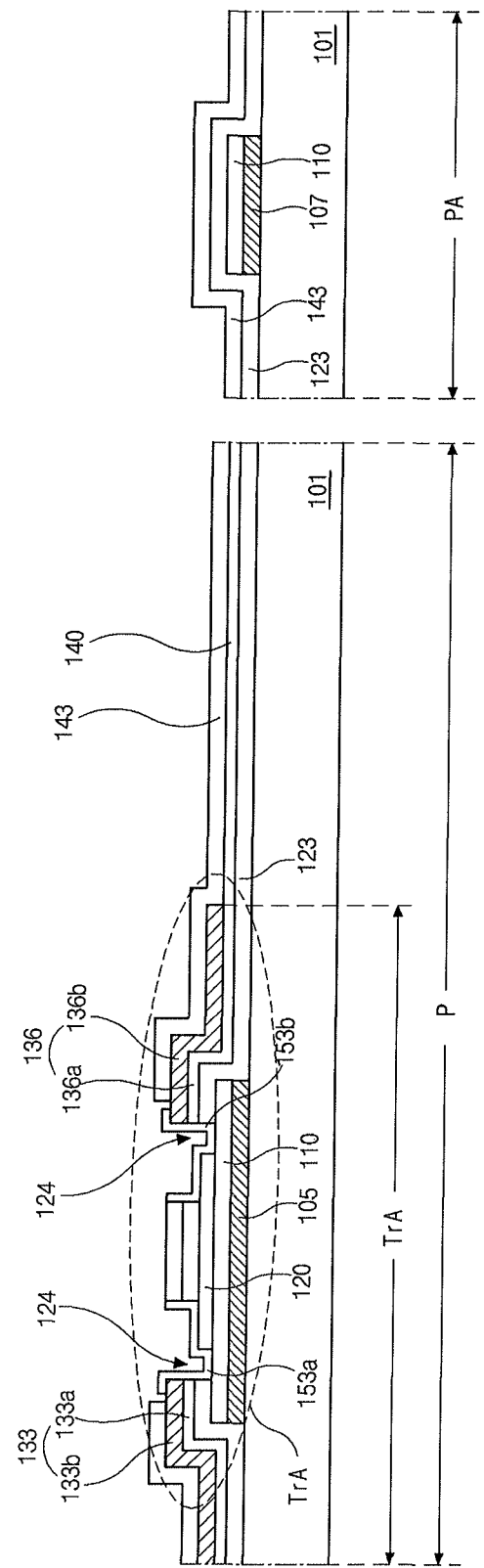
Figure 4O:
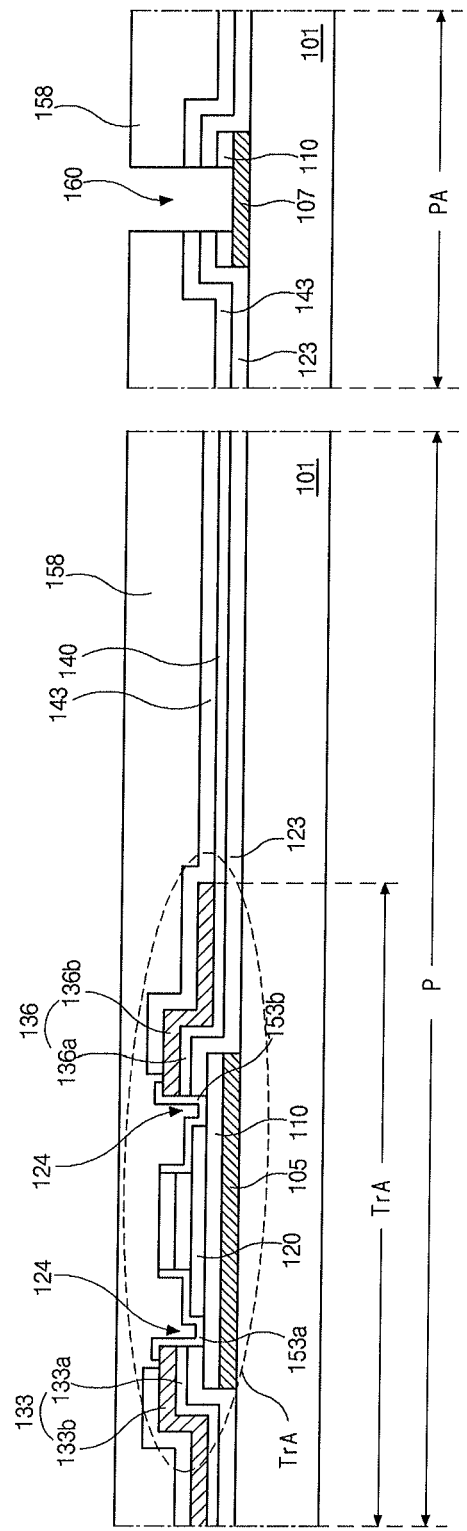
Figure 4P:
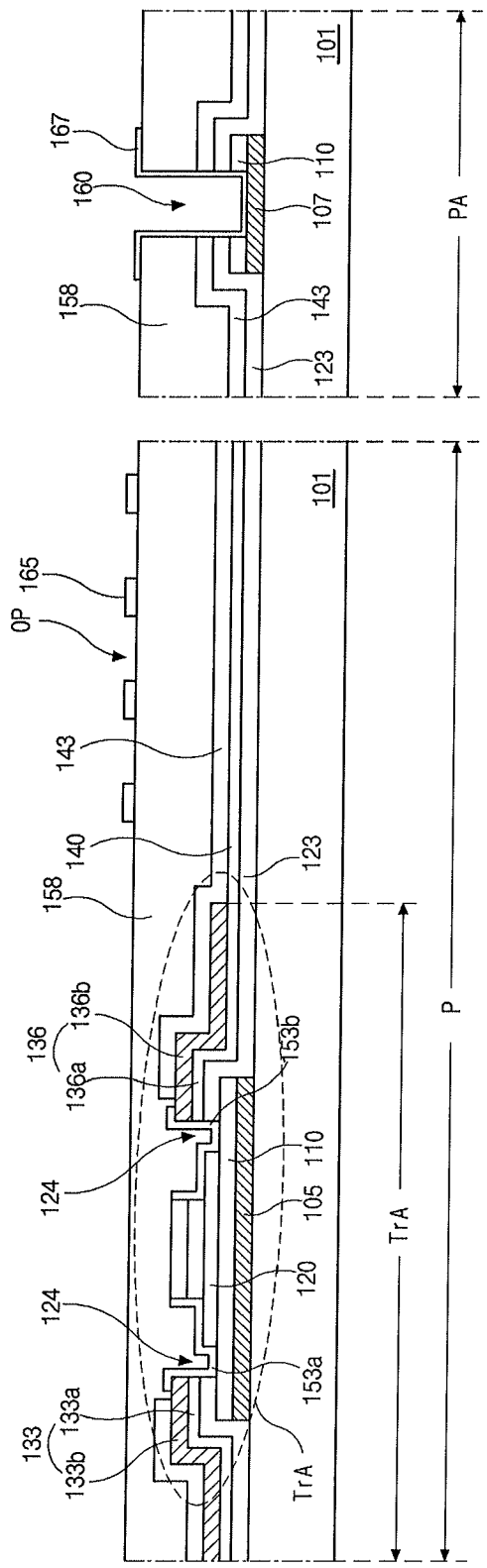

FIGS. 4A to 4P are cross-sectional views illustrating a method of fabricating an array substrate including a thin film transistor according to the embodiment of the present invention. For the purposes of explanation, a pad portion where a gate pad electrode at an end of a gate line is formed is shown in the drawings along with a pixel region P.

Referring to FIG. 4A, one or at least two selected from a low resistance metal material group consisting of, for example, copper (Cu), copper alloy, aluminum (Al), aluminum alloy (e.g., AlNd), molybdenum (Mo), and molybdenum titanium (MoTi) is deposited on a transparent substrate 101 made of glass or plastic to form a first metal layer 102 having a single-layered or multiple-layered structure.

Then, an inorganic insulating material, for example, silicon oxide ($SiO_2$) or silicon nitride (SiNx) is deposited on the first metal layer 102 to form a first insulating layer 104. Then, an oxide semiconductor material, for example, indium gallium zinc oxide (IGZO), zinc tin oxide (ZTO) or zinc indium oxide (ZIO) is deposited to form an oxide semiconductor material layer 106 on the first insulating layer 104.

Then, a photoresist is deposited on the oxide semiconductor material layer 106 to form a first photoresist layer 181, and then the first photoresist layer 181 is light-exposed using a photo mask 191 which includes a transmissive region TA, a blocking region BA, and a semi-transmissive region HTA. The photo mask 191 may be a diffraction mask or halftone mask.

Referring to FIG. 4B, the first photoresist layer 181 is developed to form a first photoresist pattern 181a having a first thickness and a second photoresist pattern 181b having a second thickness less than the first thickness.

The first photoresist pattern 181a is formed corresponding to a portion where an island-shaped oxide semiconductor pattern (120 of FIG. 4P) is formed in the switching region TrA, and the second photoresist pattern 181b is formed corresponding to a portion where a gate line (not shown) and a gate electrode (105 of FIG. 4P) are formed.

The second photoresist pattern 181b is formed corresponding to a portion where a gate pad electrode (107 of FIG. 4P) at an end of the gate line is formed.

Since the oxide semiconductor layer is configured to overlap the gate electrode, the first photoresist pattern 181a is further formed at an overlapping part between the gate electrode and the oxide semiconductor layer out of the portion where the gate electrode is formed.

Referring to FIG. 4C, the oxide semiconductor material layer 106, the first insulating layer 104 and the first metal layer 102 are sequentially or simultaneously etched using the first and second photoresist patterns 181a and 181b as an etching mask to form the gate line, and a gate pad electrode 107 in the pad portion PA.

At the same process, the gate electrode 105 connected to the gate line is formed, and a gate insulating layer 110 and an oxide semiconductor pattern 112, which have the same plane shape with the gate electrode 105 and the gate line, are formed.

Referring to FIG. 4D, an ashing is performed to remove the second photoresist pattern 181b and thus expose the oxide semiconductor pattern 112 outside the first photoresist pattern 181a.

Through the ashing, the first photoresist pattern is reduced in thickness and remains on the center portion of the oxide semiconductor pattern 112.

Referring to FIG. 4E, the oxide semiconductor pattern 112 exposed outside the first photoresist pattern 181a is removed to form an island-shaped oxide semiconductor layer 120 corresponding to a center portion of the gate electrode 105 in the switching region TrA.

In this step, the oxide semiconductor pattern 112 over the gate line is all removed. Accordingly, the oxide semiconductor layer 120 may remain on the substrate 101 as only component made of oxide semiconductor material.

The gate insulating layer 110 over the gate line and the gate pad electrode 107 has the same plane shape as the gate line and the gate pad electrode 107.

Referring to FIG. 4F, a stripping is performed to remove the first photoresist pattern 181a and thus expose the oxide semiconductor layer 120.

Then, an inorganic insulating material, for example, silicon oxide ($SiO_2$) or silicon nitride (SiNx) is formed on the substrate 101 having the oxide semiconductor layer to form a second insulating layer 122.

Then, referring to FIG. 4G, a transparent conductive material, for example, indium tin oxide (ITO) or indium zinc oxide (IZO) is deposited on the second insulating layer 122 to form a first transparent conductive material layer. Then, one or at least two selected from a low resistance metal material group consisting of, for example, copper (Cu), copper alloy, aluminum (Al), aluminum alloy (e.g., AlNd), molybdenum (Mo), and molybdenum titanium (MoTi) is deposited on a first transparent conductive material layer (not shown) to form a second metal layer (not shown) having a single-layered or multiple-layered structure.

Then, a second photoresist layer is formed on the second metal layer and light-exposed using a photo mask which includes a transmissive region TA, a blocking region BA, and a semi-transmissive region HTA to form a third photoresist pattern having a third thickness and a fourth photoresist pattern to having a fourth thickness less than the third thickness.

Then, the second metal layer and the first transparent conductive material layer are etched using the third and fourth photoresist patterns to form a data line (not shown) crossing the gate line, a data pad electrode at an end of the data line, and source and drain electrodes 133 and 136 spaced apart from each other with the oxide semiconductor layer 120 therebetween.

Then, an ashing is performed to remove the fourth photoresist pattern and thus expose the second metal layer corresponding to a center portion of the pixel region P. The third photoresist pattern remains on the data line and the source and drain electrodes 133 and 136.

Then, the second metal layer is etched using the third photoresist pattern to form a pixel electrode 140 in the pixel region P.

The pixel electrode 140 extends from the lower layer 136a of the drain electrode 136 and is thus electrically connected to the drain electrode 136.

Then, a stripping is performed to remove the photoresist pattern on the data line and the source and drain electrodes 133 and 136 and thus expose the data line and the source and drain electrodes 133 and 136.

The data line and the source and drain electrodes 133 and 136 have the lower layers 133a and 136a and the upper layers 133b and 136b having a single-layered or multiple-layered structure. Accordingly, the data line and the source and drain electrodes 133 and 136 have at least double-layered structure.

Referring to FIG. 4H, an inorganic insulating material, for example, silicon oxide (SiO$_2$) or silicon nitride (SiNx), or an organic insulating material, for example, photo acrylic or benzocyclobutene (BCB) is deposited on the substrate 101 having the source and drain electrodes 133 and 136 to form a first passivation layer 143.

Referring to FIG. 4I, a photoresist is deposited on the first passivation layer 143 to form a third photoresist layer (not shown). Then, the third photoresist pattern is light-exposed using a photo mask having a transmissive region and a blocking region and developed to form a fifth photoresist pattern 195. In this process, both ends of the oxide semiconductor layer 120, the corresponding ends of the source and drain electrodes 133 and 136 which oppose the both ends of the oxide semiconductor layer 120, and separate regions between the both ends of the oxide semiconductor layer 120 and the corresponding ends of the source and drain electrodes 133 and 136 are exposed.

Then, the first passivation layer 143 and the second insulating layer 122 are etched using the fifth photoresist pattern 195 to expose the ends of the source and drain electrodes 133 and 136 and the ends of the oxide semiconductor layer 120.

Through this process, the second insulating layer 122 becomes an etch stopper 123 including a semiconductor contact hole 124 that exposes each of the both ends of the oxide semiconductor layer 120.

The etch stopper 123 is formed on the oxide semiconductor layer 120 and the other regions of the substrate 101 as well.

Since the etch stopper 123 does not have an island shape, the source and drain electrodes 133 and 136 do not need to be formed long to secure a contact margin with the oxide semiconductor layer 77 exposed outside the etch stopper 123.

Accordingly, an overlapping area between the source and drain electrodes 133 and 136 and the gate electrode 105 can be reduced, and thus parasitic due to the overlapping can be reduced.

Referring to FIG. 4J, a transparent conductive material, for example, indium tin oxide (ITO) or indium zinc oxide (IZO), or a low resistance metal material, for example, copper (Cu), copper alloy, aluminum (Al), aluminum alloy (e.g., AlNd), molybdenum (Mo) or molybdenum titanium (MoTi) is deposited on the fifth photoresist pattern 195 to form a conductive material layer 150.

The conductive material layer 150 located at portions exposed outside the fifth photoresist pattern 195 (which is referred to as first and second separate regions A1 and A2) contacts the ends of the source and drain electrodes 133 and 136, which are exposed outside the first passivation layer 143, together with the ends of the oxide semiconductor layer 120 which are exposed through the semiconductor contact hole 124.

Referring to FIG. 4K, an organic material is deposited on the conductive material layer 150 to form an organic layer 198, which fills the separate regions A1 and A2 and is entirely on the substrate 101.

The organic layer 198 includes a portion 198a, which is formed over the photoresist pattern 195, and the other portion 198b which is formed to fill the separate regions A1 and A2 is different in thickness from the portion 198a. The other portion 198b is much greater than the portion 198a.

Referring to FIG. 4L, an ashing is performed for the organic layer 198 to reduce thickness of the organic layer 198.

In the ashing, the thickness of the organic layer 198 is reduced at the same rate over all. The ashing is performed until a surface of the conductive material layer 150 over the second photoresist pattern 195 is exposed. Accordingly, the portions of the organic layer 198 except for the other portion 198b formed at the first and second separate regions A1 and A2 are removed.

Since the other portion 198b is formed thick at the first and second separate regions A1 and A2, the other portion 198b is reduced in thickness and remains there even when the ashing is finished. The remaining other portion 198b becomes a organic pattern 199.

Referring to FIG. 4M, the conductive material layer 150 outside the organic pattern 199 is etched to expose the fifth photoresist pattern 195.

In this etching, portions of the conductive material layer 150 covered by the organic pattern 199 remain and become connection patterns 153a and 153b that contact the respective both ends of the oxide semiconductor layer 120 and the respective ends of the source and drain electrodes 133 and 136.

The connection patterns 153a and 153b are formed at the regions where the corresponding semiconductor contact holes are formed. In other words, two connection patterns are formed in each switching region TrA. The connection patterns 153a and 153b are spaced apart from each other.

The gate electrode 105, the gate insulating layer 110, the oxide semiconductor layer 120, the etch stopper 123 having the semiconductor contact hole 124, the source and drain electrodes 133 and 136, and the connection patterns 153a and 153b in the switching region TrA form a thin film transistor Tr.

Referring to FIG. 4N, a stripping is performed to remove the fifth photoresist pattern 195 and the organic pattern 199 and thus expose the connection patterns 153a and 153b and the first passivation layer 143.

Another method of forming the connection patterns 153a and 153b using a lift-off method may be employed, which is explained with reference to FIGS. 5A and 5B.

Figure 5A:
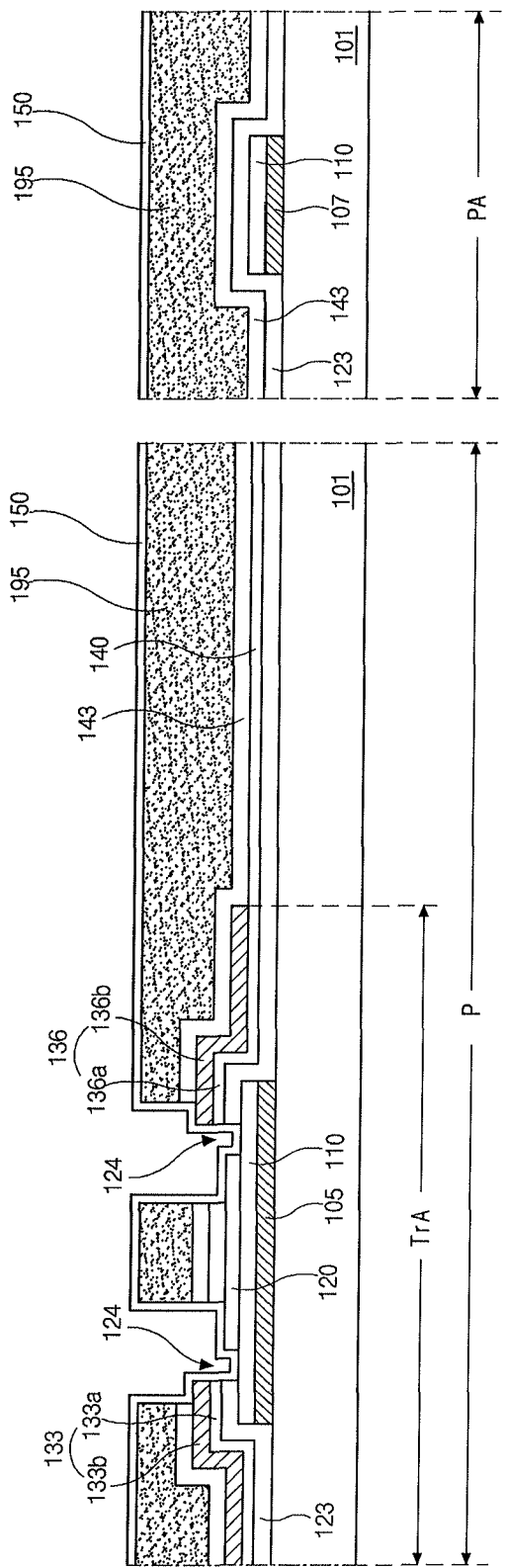

Referring to FIGS. 5A and 5B, the conductive material layer 150 is formed on the fifth photoresist pattern 195, and then, without forming the organic layer 199 shown in FIG. 4M, a stripping is performed to remove the fifth photoresist pattern 195. Accordingly, performed is a lift-off process of removing the conductive material layer 150 on the fifth photoresist pattern 195 together with the fifth photoresist pattern 195.

Through the lift-off process, the conductive material layer 150 remains at the first and second separate regions A1 and A2 and becomes the connection patterns 153a and 153b.

The method using the organic pattern 199 can form the connection patterns 153a and 153b more stably than the method using the lift-off process.

The other method has advantage of reduction of process compared to the method using the organic pattern 199. However, when a stripping solution to remove the fifth photoresist pattern 195 does not permeates an interface between the fifth photoresist pattern 195 and the second passivation layer 143 due to the conductive material layer 150, a pattern defect occurs. Accordingly, the method using the organic pattern 199 is preferable in view of stability.

However, it is obvious that the connection patterns 153a and 153b can be formed by the alternative method.

Referring to FIG. 4O, after the connection patterns 153a and 153b are formed with one of the above-described methods, an inorganic insulating material, for example, silicon oxide ($SiO_2$) or silicon nitride (SiNx), or an organic insulating material, for example, photo acrylic is deposited on the connection patterns 153a and 153b and the first passivation layer 143 to form a second passivation layer 158.

Then, a mask process of deposition of photoresist, light exposure, developing, etching and stripping is performed for the second passivation layer 158, or a mask process of deposition of photoresist, light exposure, developing, etching and stripping is performed for the second passivation layer 158 made of photo acrylic. The second passivation layer 158 is patterned through this process, and thus a gate pad contact hole 160 exposing the gate pad electrode 107 and a data pad contact hole (not shown) exposing the data pad electrode are formed at the pad portion PA.

In patterning the second passivation layer 158, the first passivation layer 143, the etch stopper 123 and the gate insulating layer 110 over the gate pad electrode 107 are also removed to expose the gate pad electrode 107, and the first passivation layer 143 over the data pad electrode is also removed to expose the data pad electrode.

Referring to FIG. 4P, a transparent conductive material, for example, indium tin oxide (ITO) or indium zinc oxide (IZO) is deposited on the second passivation layer 158 to form a second transparent conductive material layer (not shown), and then the second transparent conductive material layer is patterned in a mask process to form a common electrode including bar-shaped openings op in each pixel region P. At the same process, a gate auxiliary pad electrode 167 contacting the gate pad electrode 107 through the gate pad contact hole 160 and a data auxiliary pad electrode (not shown) contacting the gate pad electrode through the gate pad contact hole are formed at the pad portion PA.

Through the above-described processes, the array substrate of the embodiment can be fabricated.

Yet another method may be employed, which is explained with reference to FIGS. 6A to 6F. This other method is similar to the above-described method except for forming the connection patterns 153a and 153b.

Figure 6A:
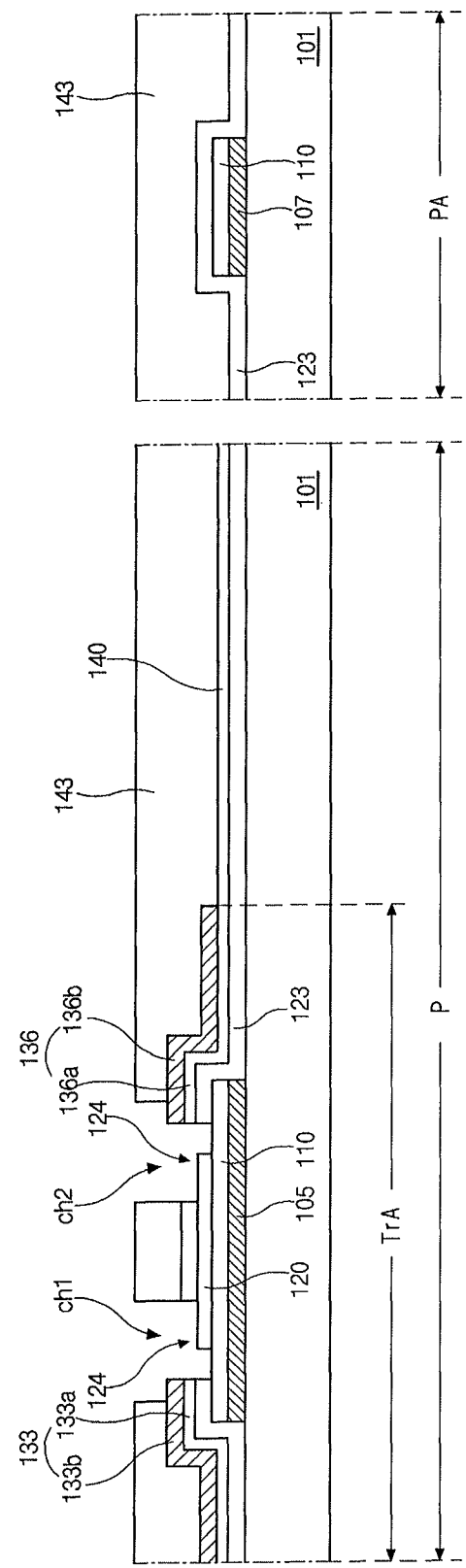

Referring to FIG. 6A, the first passivation layer 143 is formed on the source and drain electrodes 133 and 136, and a mask process is performed to pattern the first passivation layer 143 and the second insulating layer (122 of FIG. 4H). Accordingly, first and second contact holes ch1 and ch2 are formed that expose the ends of the source and drain electrodes 133 and 136 and the both ends of the oxide semiconductor layer 120.

The second insulating layer 122 becomes an etch stopper 123 having the semiconductor contact holes 124 that expose the both ends of the oxide semiconductor layer 120.

In this method, it is preferred that the first passivation layer 143 is made of an organic insulating material, for example, photo acrylic or benzocyclobutene (BCB) to have a substantially flat surface.

When the first passivation layer 143 is made of an inorganic insulating material, a center portion of the pixel region P is lower than a portion where the source and drain electrodes 133 and 136 are formed. In this case, in forming the connection patterns 153a and 153b later, the connection patterns 153a and 153b may not be desirably formed. Accordingly, it is preferred that the first passivation layer 143 made of organic insulating material is used and thus the surface thereof is located higher than the source and drain electrodes 133 and flat.

Figure 6B:
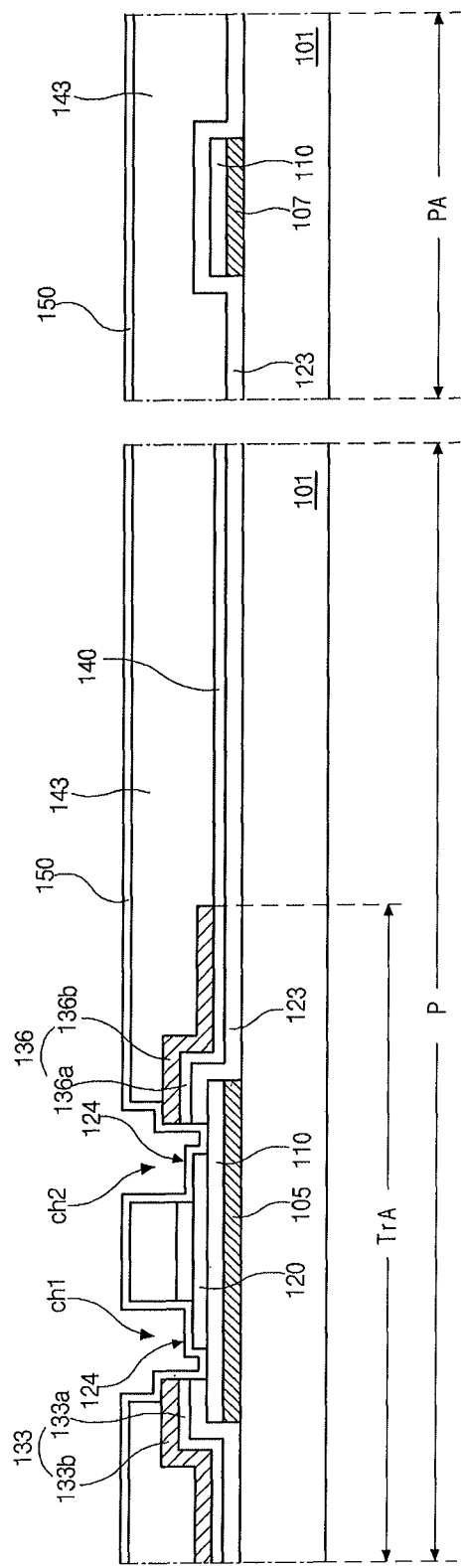

Referring to FIG. 6B, a transparent conductive material, for example, indium tin oxide (ITO) or indium zinc oxide (IZO), or a low resistance metal material, for example, copper (Cu), copper alloy, aluminum (Al), aluminum alloy (e.g., AlNd), molybdenum (Mo), or molybdenum titanium (MoTi) is deposited on the first passivation layer 143 to form a conductive material layer 150.

The conductive material layer 150 contacts the ends of the source and drain electrodes 133 and 136, which is exposed through the contact holes ch1 and ch2 of the first passivation layer 143, and the both ends of the oxide semiconductor layer 120 which is exposed through the semiconductor contact holes 124.

Figure 6C:
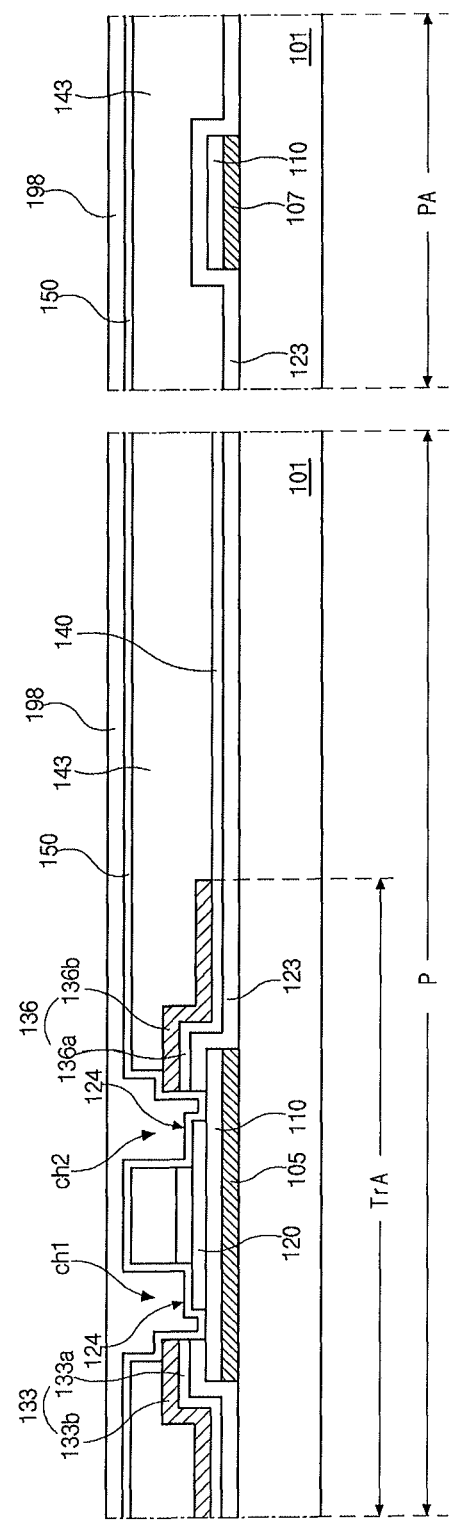

Referring to FIG. 6C, an organic material is deposited on the conductive material layer 150 to form an organic layer 198, which fills the first and second contact holes ch1 and ch2. The organic layer 198 has a substantially flat surface, a portion thereof at the contact holes ch1 and ch2 is thicker than other portion thereof.

Referring to FIG. 6D, an ashing is performed for the organic layer 198 to reduce thickness thereof.

In the ashing, the thickness of the organic layer 198 is reduced at the same rate over all. The ashing is performed until a surface of the conductive material layer 150 over the first passivation layer 143 is exposed. Accordingly, portions of the organic layer 198 except for the portion 199 formed at the first and second contact holes ch1 and ch2 are removed.

Since the other portion 199 is formed thick at the first and second contact holes ch1 and ch2, the portion 199 is reduced in thickness and remains there even when the ashing is finished. The remaining portion 199 becomes an organic pattern 199.

Figure 6E:
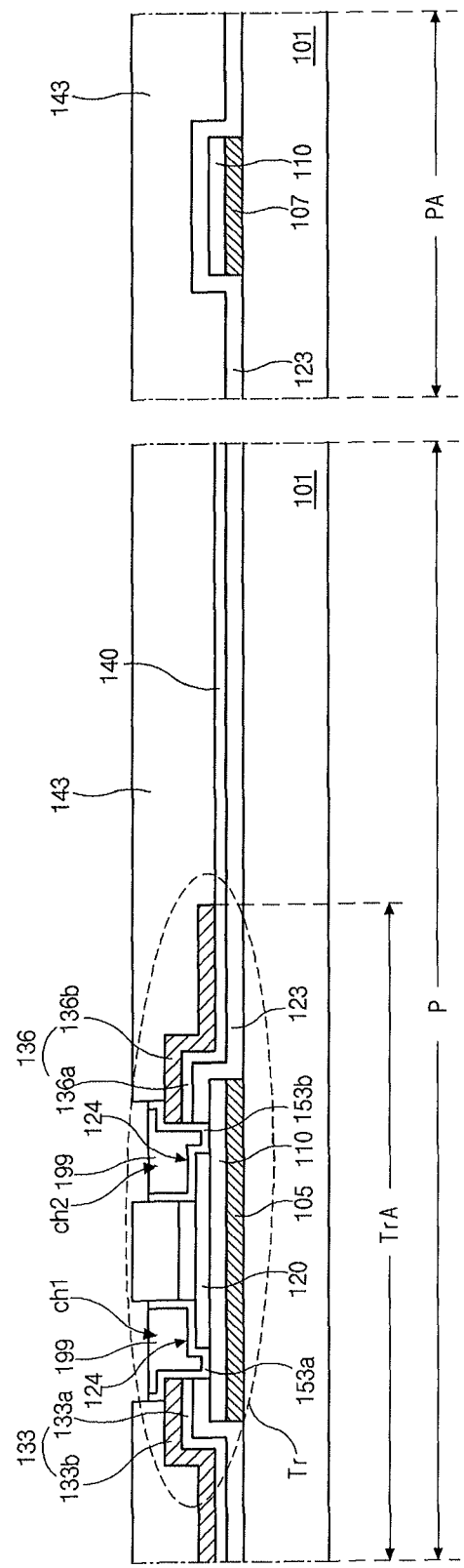

Referring to FIG. 6E, the conductive material layer 150 outside the organic pattern 199 is etched to expose the first passivation layer 143.

In this etching, portions of the conductive material layer 150 covered by the organic pattern 199 remain and become connection patterns 153a and 153b that contact the respective both ends of the oxide semiconductor layer 120 and the respective ends of the source and drain electrodes 133 and 136.

Figure 6F:
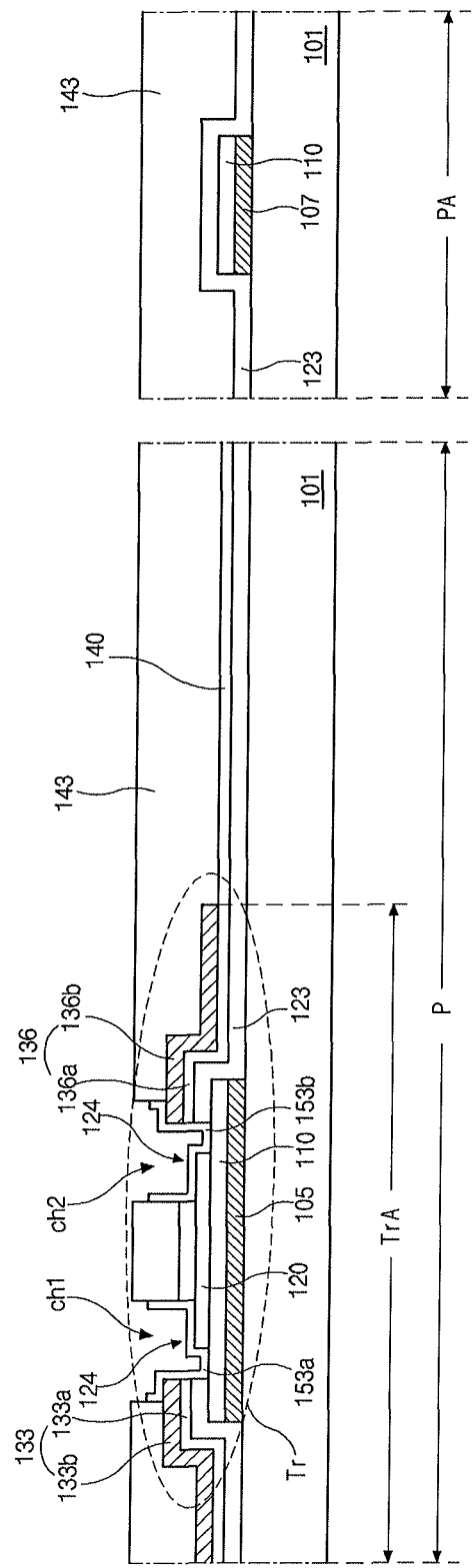

Referring to FIG. 6F, the organic patterns 199 is removed by a stripping to expose the connection patterns 153a and 153b.

The processes after the process shown in FIG. 6F are similar to those of FIGS. 4O and 4P, and detailed explanations are omitted.

As described above, according to the embodiment, the array substrate can be fabricated can be fabricated with five mask processes. Accordingly, a number of mask processes can be reduced by two or three.

Further, the etch stopper is formed on the entire surface of the substrate, and the source and drain electrodes are connected with the oxide semiconductor layer through the connection patterns. Accordingly, overlapping area between the source and drain electrodes and the gate electrode can be reduced compared to the related art. Therefore, parasitic capacitance due to overlapping between the source and drain electrodes and the gate electrode can be reduced.

It will be apparent to those skilled in the art that various modifications and variations can be made in the present invention without departing from the scope of the invention. Thus, it is intended that the present invention cover the modifications and variations of this invention provided they come within the scope of the appended claims and their equivalents.

What is claimed is:

1. A method of fabricating an array substrate, the method comprising:

forming a gate electrode on a substrate, a gate insulating layer on the gate electrode, an island-shaped oxide semiconductor layer on the gate insulating layer corresponding to the gate electrode;

forming an etch stopper on the oxide semiconductor layer and entirely over the substrate;

forming a source electrode, a drain electrode and a pixel electrode on the etch stopper, wherein the source and drain electrodes are spaced apart from each other with the oxide semiconductor layer therebetween, wherein the pixel electrode is connected to the drain electrode;

forming a first passivation layer on the source and drain electrodes and the pixel electrode and entirely over the substrate;

forming a photoresist layer on the first passivation layer;

forming first and second separate regions including first and second contact holes, respectively, the first separate region being located where an end of the oxide semiconductor layer and an end of the source electrode opposing each other are formed, and the second separate region being located where the other end of the oxide semiconductor layer and an end of the drain electrode opposing each other are formed;

forming a conductive material layer on the photoresist layer and positioned at least in the first and second separate regions to form connection patterns which connect the oxide semiconductor layer to the source and drain electrodes at the first and second contact holes, respectively, stripping the photoresist layer on which the conductive material layer is formed to remove both the conductive material layer on the photoresist layer and the photoresist layer together.

* * * * *

UNITED STATES PATENT AND TRADEMARK OFFICE
CERTIFICATE OF CORRECTION

PATENT NO.        : 9,923,068 B2
APPLICATION NO.   : 15/366936
DATED             : March 20, 2018
INVENTOR(S)       : Yang It is certified that error appears in the above-identified patent and that said Letters Patent is hereby corrected as shown below:

Column 14, Lines 15-16:
"the first and second contact holes, respectively" should read, --the first and second contact holes, respectively; and--.

Signed and Sealed this
Seventeenth Day of July, 2018

Andrei Iancu
*Director of the United States Patent and Trademark Office*